United States Patent [19]

Stevenson

[11] 3,728,691

[45] Apr. 17, 1973

[54] INTEGRATED CIRCUITS FOR MULTIPLEXING

[76] Inventor: George Earley Stevenson, 15, Townsend Crescent, Kircaldy, Scotland

[22] Filed: June 3, 1971

[21] Appl. No.: 149,455

[30] Foreign Application Priority Data

Feb. 9, 1970 Great Britain......................6,166/70

[52] U.S. Cl................................................340/172.5

[51] Int. Cl................................................G06f 1/00

[58] Field of Search.................................179/15 A; 340/172.5 R, 172.5 L

[56] References Cited

UNITED STATES PATENTS 3,614,327 10/1971 Low...................................179/15 A 3,626,382 12/1971 Pedersen...........................340/172.5

3,633,177 1/1972 Caldwell...........................340/172.5

*Primary Examiner*—Ralph D. Blakeslee

*Attorney*—James and Franklin

[57] ABSTRACT

Integrated circuits comprising arrays of digital logic elements interconnected amongst the circuits by data transmission conductors which are fewer in number than the digital data channels of the arrays, the digital data channels being connected to the data transmission conductors by semiconductor switching elements which are so switched as to produce a multiplexed transmission of digital data between the channels and conductors, the switching of the switching elements of the circuits being synchronised by one of said data transmission conductors or a further conductor.

25 Claims, 5 Drawing Figures

FIG. I.

INVENTOR
GEORGE EARLEY STEVENSON
BY
ATTORNEY

INVENTOR
GEORGE EARLEY STEVENSON
BY James and Franklin
ATTORNEY

PATENTED APR 17 1973 3,728,691

INVENTOR
GEORGE EARLEY STEVENSON
BY James and Franklin
ATTORNEY

INVENTOR
GEORGE EARLEY STEVENSON
BY James and Franklin
ATTORNEY

INVENTOR
GEORGE EARLEY STEVENSON
BY James and Franklin
ATTORNEY

INTEGRATED CIRCUITS FOR MULTIPLEXING

BACKGROUND OF THE INVENTION

This invention relates to electrical circuit components and concerns such components in the form of integrated circuits having a plurality of circuit elements forming an array of digital logic elements. The invention is particularly applicable to integrated circuits in which a purality of insulated gate field effect semiconductor devices are formed on a single substrate.

Such integrated circuits have a number of external connections or bonding pads which are normally connected to pins of a package accommodating the circuit. It is known that the reliability and yield of the circuits and their packaging cost are related to the number of such bonding pads.

It is an object of the present invention, therefore, to reduce the number of such bonding pads.

SUMMARY OF THE INVENTION

According to the present invention, there is provided in an integrated circuit including an array of digital logic elements having *n* digital data channels, the improvement which comprises:

*m* (<*n*) conductors for connecting said channels to corresponding channels of another such circuit;

*n* semiconductor switching devices connecting respective ones of said *n* channels to said *m* conductors;

clock pulse input means for receiving at least one clock pulse train; and pulse generating means having input means connected to said clock pulse input means and output means connected to said switching elements and being operable to produce a plurality of pulse trains, havlng different phases and a repetition rate determined by said at least one clock pulse train, for controlling the switching of said switching devices for a multiplexed transmission of data between said *n* channels and said *m* conductors.

It will be seen that the provision of *m conductors and n* switching devices integrally with the logic array can effectively reduce by *n–m* the number of external connections or bonding pads for the circuit and thus reduce the number of connections or pins of a package to accommodate the circuit. By way of example, using a complex logic array in the circuit such as a read-only memory of 2,048 bits, the number of package pins could be reduced from, say, 26 to 16, 14 or even 12 pins. This can involve a significant reduction in packaging costs and increase the reliability and yield of the circuit.

In one embodiment of the integrated circuit the means for providing a plurality of pulse trains to control the switching of said switching devices also provides pulses for synchronising the operation of the circuit with another such circuit. Such means may be, or include, a stepping register or shift register or counter arranged to produce a plurality of pulse trains of different phase positions from fewer clock pulse trains or even from a single clock pulse train.

Whatever the form of these means, only a portion of it may exist in the integrated circuit itself. The remaining portion might then be common to a plurality of such circuits for the purpose of synchronisation.

The means for providing the pulse trains may comprise, for example, a shift counter, such as a 2-bit counter formed of four half-shift stages, and a decoder of logic gates for deriving the distinct clock pulse trains from outputs of the counter.

Synchronisation between circuit components may be achieved via one of the data transmission lines between integrated circuits or by a separate line. One integrated circuit may constitute a master component and an integrated circuit connected thereto may constitute a slave component to be synchronised from the master component. Thus, a master component preferably incorporates means for providing a synchronising signal and the slave component then has means for processing this signal to achieve synchronisation of the slave component.

When synchronisation is to be achieved by a data transmission line, the synchronisation signal may be different from transmitted data, when necessary to avoid the slave component locking onto data. For example, when the switching frequency or rate of the switching elements is higher than the rate of change of data, each piece of data will contain the sequences '1,1' and '0,0', so that a synchronising signal '1,0,1,0 . . . ' would be appropriate. Such a signal could be obtained from one of the pulse trains derived for controlling the switching devices, for example by a "divide-by-two" circuit.

For synchronisation purposes, the or each slave component may include an equivalence function device, i.e., an identity, or equivalence, gate or an exclusive OR gate, to detect whether or not the slave and master components are synchronised. In the absence of synchronisation, the means for generating pulse trains in the slave component may be blocked until the master component becomes in step with the, blocked, slave component, when said function will cause said generating means to release.

DESCRIPTION OF THE DRAWINGS

For a better understanding of the invention and to show how the same may be carried into effect, reference will now be made, by way of example, to the accompanying drawings, in which:

FIG. 1 illustrates an embodiment of the invention on each of two integrated circuits, forming a bidirectional data transmission system between the circuits on at least one common data line and having a synchronisation line separate from the data line or lines.

Figure 1:
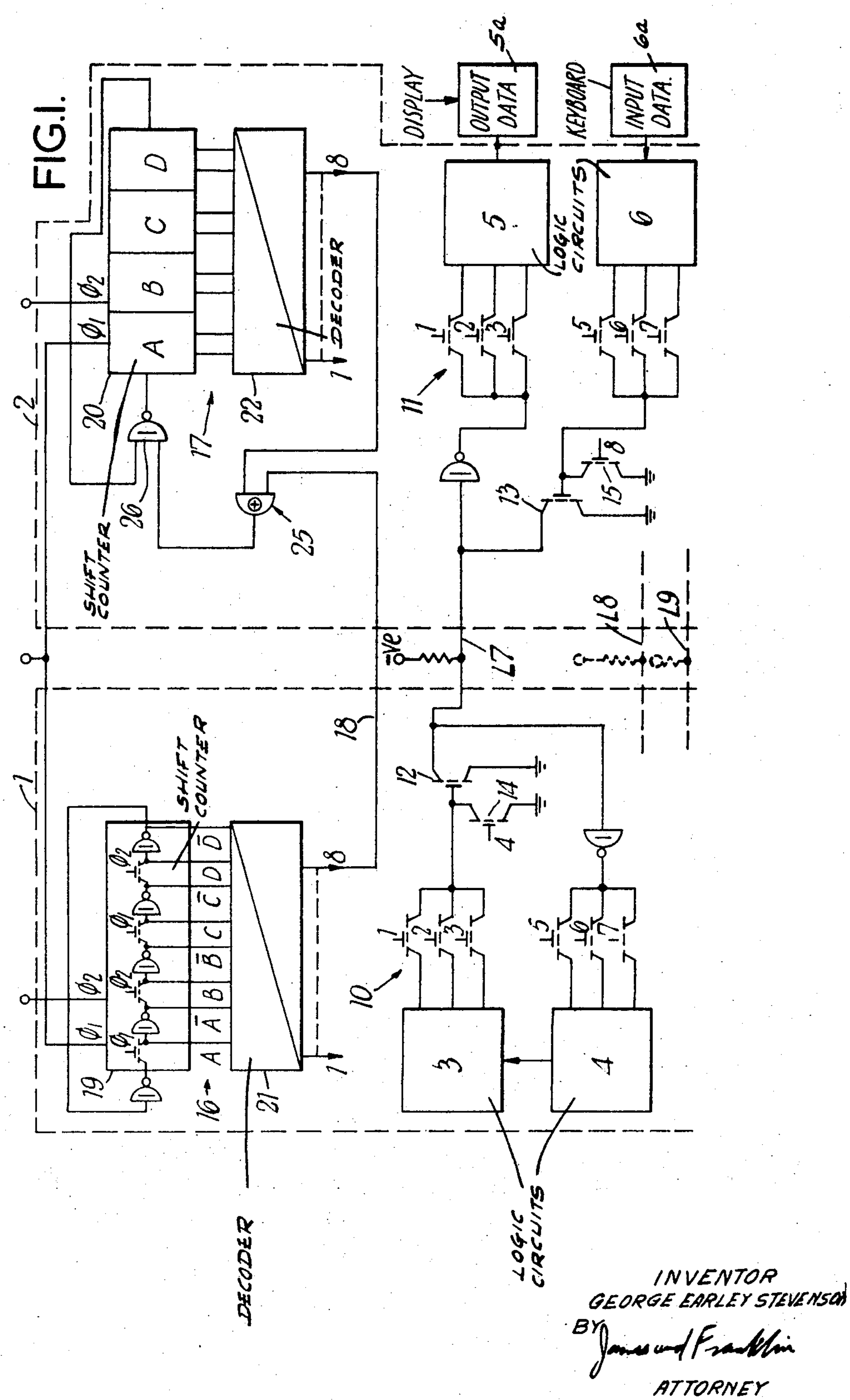
FIG. 1 is diagram of two integrated circuits forming a bidirectional data transmission system, with a separate synchronisation line.

The two integrated circuits are formed on respective semiconductor chips 1 and 2, the chip 1 being the master chip in respect of synchronisation and chip 2 being the slave chip.

In this embodiment and the subsequent embodiments, all the circuit elements on the chips, apart from conductors, are enhancement mode *p*-channel insulated-gate field effect devices, which will be referred to hereinafter as MIS devices. Furthermore, the logic elements of these embodiments are operated according to negative logic, although other logic systems could be employed.

The chips 1 and 2 have a plurality of digital logic circuits, including circuits 3, 4, 5 and 6. Logic circuits of one chip are connected, for data transmission, to logic circuits of the other chip by a number of digital data transmission lines L7, L8, L9 . . . and so on, the number of these data transmission lines between the chips being less than the number of data channels to the logic circuits on each chip. In this example, six data channels from the logic circuits 3 and 4 have a common data transmission line L7. In a practical case, thirty data channels on one chip may be connected in five groups of six channels by five data transmission lines L7, L8, L9 . . . , to respective ones of five groups of six channels on the other chip. For clarity, the details associated with the line L7 only have been illustrated. The logic circuits 3, 4, 5 and 6 are here illustrated only schematically and are intended to designate typical logic circuitry of a quite conventional nature. For example, in the embodiment of FIG. 1, chip 2 typically might comprise an interfacing means for interfacing between computation circuits 3 and 4 of the type normally found in data processing or computer equipment and an output display 5*a* and an input keyboard 6*a*. By way of example, circuits 3 and 4 might include a memory, shift gates, an arithmetic unit (OR, AND GATES) and means for effecting operations in accordance with a program stored in the memory, all as is well known in the art. In the case where chip 2 serves as an input-output interfacing chip as described above, the input circuit 6 would typically be a device for encoding keyboard data into the appropriate binary coding system for the circuitry. Such encoders are well known in the art and may be designed by one skilled in the art for the specific application. Similarly, the output circuit 5 would typically comprise a decoder arrangement for converting the binary signals it receives into signals suitable for operating the display. Here again, such decoders are well known in the art.

The six channels of the circuits 3 and 4 are connected to the line L7 by respective MIS devices 10 and the corresponding channels of the circuits 5 and 6 are connected to the line L7 respective MIS devices 11.

The logic circuits 3 and 6, which are intended to emit data, have their associated MIS devices 10 and 11 connected to the line L7 via inverting MIS devices 12 and 13 the gates of which are connected to their source-drain paths by MIS devices 14 and 15.

The logic circuits 4 and 5, which are intended to receive data, have their associated MIS devices 10 and 11 connected to the data transmission line L7 via inverters.

Data is transmitted between the chips by switching the MIS devices 10 and 11 on and off cyclically and in the sequence denoted by the numerals 1, 2, 3, 5, 6 and 7 at the gates of these devices. The switching cycle has a frequency greater than that of the data change at the outputs of the logic circuits 3 and 6.

When a plurality of the data transmission lines is employed, the group of devices 10 and 11 are duplicated and will be switched simultaneously for each transmission line. Then, all the MIS devices 10 and 11 having the same numeral at their gates will be switched simultaneously to provide communication between the logic circuits 3 and 5 or 6 and 4 and simultaneously between equivalent circuits coupled to the other transmission lines L8, L9 and so on.

The MIS devices 10 and 11 are controlled by clock pulse trains generated on the chips by generators 16 and 17 synchronised by way of a synchronising line 18 and fed with a clock pulse phase $\theta_1$ generated externally of the chips at a frequency of 400 $H_z$ for example. A clock pulse phase $\theta_2$ is also utilised and may also be generated externally of the chips or may be derived by circuitry on the chips from the phase $\theta_1$. A single synchronising line 18 is used even with a plurality of data transmission lines L7, L8, L9 and so on.

The generators 16 and 17 each comprise a two-bit shift counter 19, 20 and a decoder 21, 22 of logic gates having eight outputs 1 to 8 providing eight distinct pulse trains with eight different phase positions.

Figure 4:
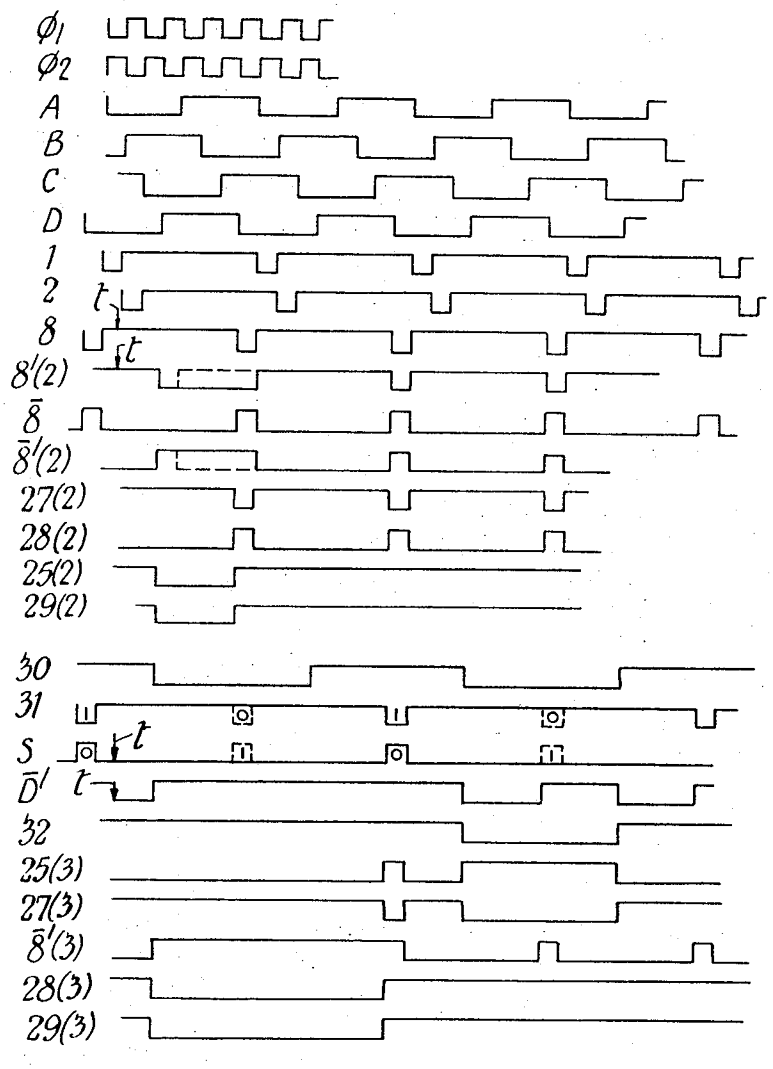
FIG. 4 is a diagram showing waveforms occurring in the embodiments of FIGS. 1 to 3.

The waveforms relating to the clock pulse trains are illustrated in FIG. 4. The upper two lines of FIG. 4 denoted $\theta_1$ and $\theta_2$ show the clock phases $\theta_1$ and $\theta_2$, the next four lines, denoted A, B, C and D, show the outputs A, B, C and D of the shift counters and the next three lines, denoted 1, 2 and 8, show the outputs 1, 2 and 8 of the eight outputs 1 to 8 of the decoders. The decoders may be constructed of NAND gates, for example, to produce these eight outputs. For example, the output signal 1 would appear at the output of a first NAND GATE receiving the A and B signals as inputs (it will be observed that the output signal 1 is negative only when both the A and B signals are negative). The output signal 2 is generated by a second NAND GATE receiving the B and C signals as inputs, and so on for the eight possible combinations of signals having the required overlap pulse width. The resulting pulse train comprises eight consecutive pulses having a pulse repetition rate equal to that of one of the shift register output signals A, B, C and D.

The eight outputs 1 to 8 define respective ones of eight time slots recurring with a frequency which is one quarter of the frequency of the clock phases $\theta_1$ and $\theta_2$. The time slots 1 to 3 and 5 to 6 are utilised to switch the MIS devices 10 and 11 and the time slots associated with these devices are numerically indicated adjacent their gates.

The time slot 4 is utilised to switch on the MIS device 14 to ground the gate of MIS device 12 positively to disable the device 12 to permit subsequent transmission to circuit 4. Similarly, the time slot 8 is utilised to switch off and disable MIS device 13 to permit subsequent transmission to logic circuit 5 from the transmission line L7.

The time slot 8 is also used to synchronise the operation of the chips 1 and 2, bearing in mind that data transmission does not occur during this time slot.

Summarizing, respective data are transmitted from logic circuit 3 to logic circuit 5 in time slots 1 to 3 and from logic circuit 6 to logic circuit 4 in time slots 5 to 7, the change in transmission direction being prepared during time slots 4 and 8 and synchronisation being achieved in time slot 8.

Synchronisation is achieved by a comparison circuit comprising an exclusive OR gate 25 feeding one input of a feedback NOR gate 26 of the counter 20.

If the counters 19 and 20 are in synchronism, it will be seen that the output of gate 25 is continuously "0." This "0" presented to one input of the NOR gate 26 effectively maintains the gate 26 open for continuous operation of the counter 20.

On the other hand, if the counters 19 and 20 are not in synchronism, the output of the gate 25 is "1," which maintains the output of gate 26 at "0" regardless of the signal at its other input. Accordingly, the counter 20 will count only until an output appears at the slave output 8 (a=0, B=1, C=0, D=1). The counter 20 will then be blocked at time slot 8. Shortly after the blocking of counter 20, counter 19 will reach time slot 8 and release counter 20 for synchronous operation.

Figure 2:
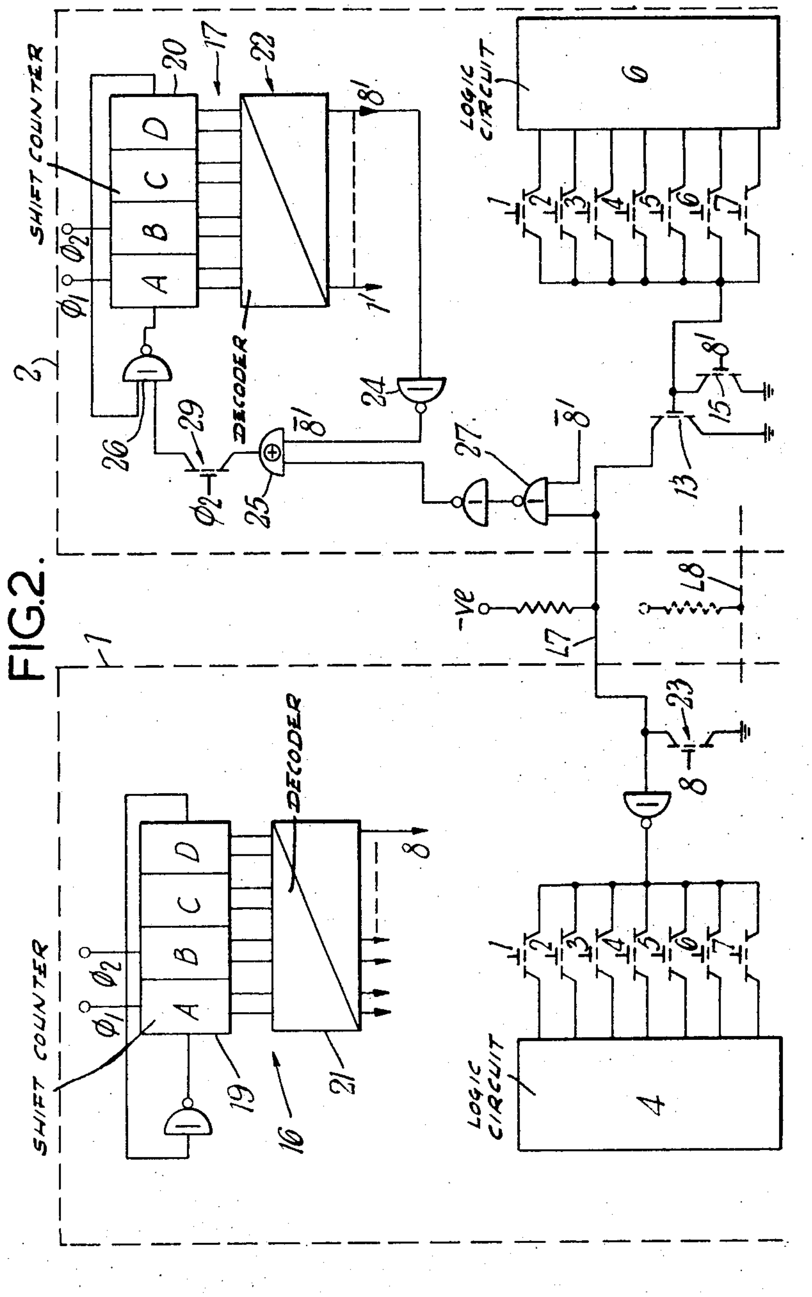
FIG. 2 is a diagram of two integrated circuits forming a unidirectional dta transmission system, with synchronisation achieved via one of the data transmission lines.

FIG. 2 illustrates a modified embodiment having chips 1 and 2 connected by data transmission lines L7, L8 and so on and with digital data passlng only from chip 2 to chip 1. In this case synchronisation occurs via the transmission line L7. As data flow is unidirectional, all of time slots 1 to 7 are used for data transmission and time slot 8 is used for synchronisation.

Synchronisation is achieved in time slot 8 by way of an inverter 23 on the master chip transmitting a signal $\overline{8}$ from the master chip 1 via line L7 to the slave chip 2 where this signal is compared, after processing in a NOR gate 27 and an inverter 28, in the exclusive OR gate 25 with the slave decoder signal $\overline{8}$, denoted $\overline{8}'$, via an inverter 24. The output of the gate 25 is fed to the gate 26 via a delay or isolating device 29 which causes the output of gate 25 produced in $\theta_2$ time to remain at gate 26 in the subsequent $\theta_1$ time, being stored there by the capacitance of the gate input. Device 29 may be omitted if sufficient delay occurs without it. If the chips are operating in phase, the output of NOR gate 27 is "0" in time slots 1 to 7 and "1" in time slot 8. Thus, in time slots 1 to 7, the gate 25 receives "1" from gate 28 and "1" from inverter 24 and thus emits "0" which effectively maintains gate 26 open to permit operation of the counter 20. In time slot 8, the gate 25 receives "0" from inverter 28 and "0" from inverter 24 and thus continues to emit "0" to maintain the, synchronous, operation of counter 20.

When the chips are operating out-of-phase, the conditions are as illustrated in FIG. 4. Let the line denoted 8 represent time slot 8 of the master chip and the line denoted 8′ (2) represent time slot 8 of the slave chip of FIG. 2. Let it also be assumed that the counters commence operation at time *t*, at the beginning of the master time slot 2. The lines denoted $\overline{8}$ and $\overline{8}'$ (2) represent, respectively, the synchronising signal $\overline{8}$ fed to inverter 28 and the signal $\overline{8}'$ produced by inverter 24, the line denoted 27 (2) represents the output of gate 27 and line 28 (2) represents the output of inverter 28. The output of the exclusive OR gate 25 under these conditions is shown at the line denoted 25 (2), and its output via device 29 is shown at the line denoted 29 (2).

In the master time slot 2 generated at time *t* (in clock time $0_1$="1"), signals $\overline{8}$ and $\overline{8}'$ are both "1", so that the output of gate 25 is "0," which will produce a "0" at the output of the device 29 in the master time slot 2 and in the subsequent time slot (master slot 3, slave slot 7), and thereby permit the slave counter to operate in its slot 7 time. In the next time slot, the same signals appear, enabling the counter to operate into slot 8 time. However, in slave slot 8 time (master slot 4), the output of gate 25 becomes "1" to produce a "1" at the output of device 29 in master slot 4 and slot 5 time. This "1" will prevent the counter 20 from changing its state and it therefore becomes blocked in its state producing slave time 8. The signal shown at line $\overline{8}$ (2) will remain at "0" until the master slot 8 time is reached. The counter 20 is then released for synchronous operation.

Figure 3:
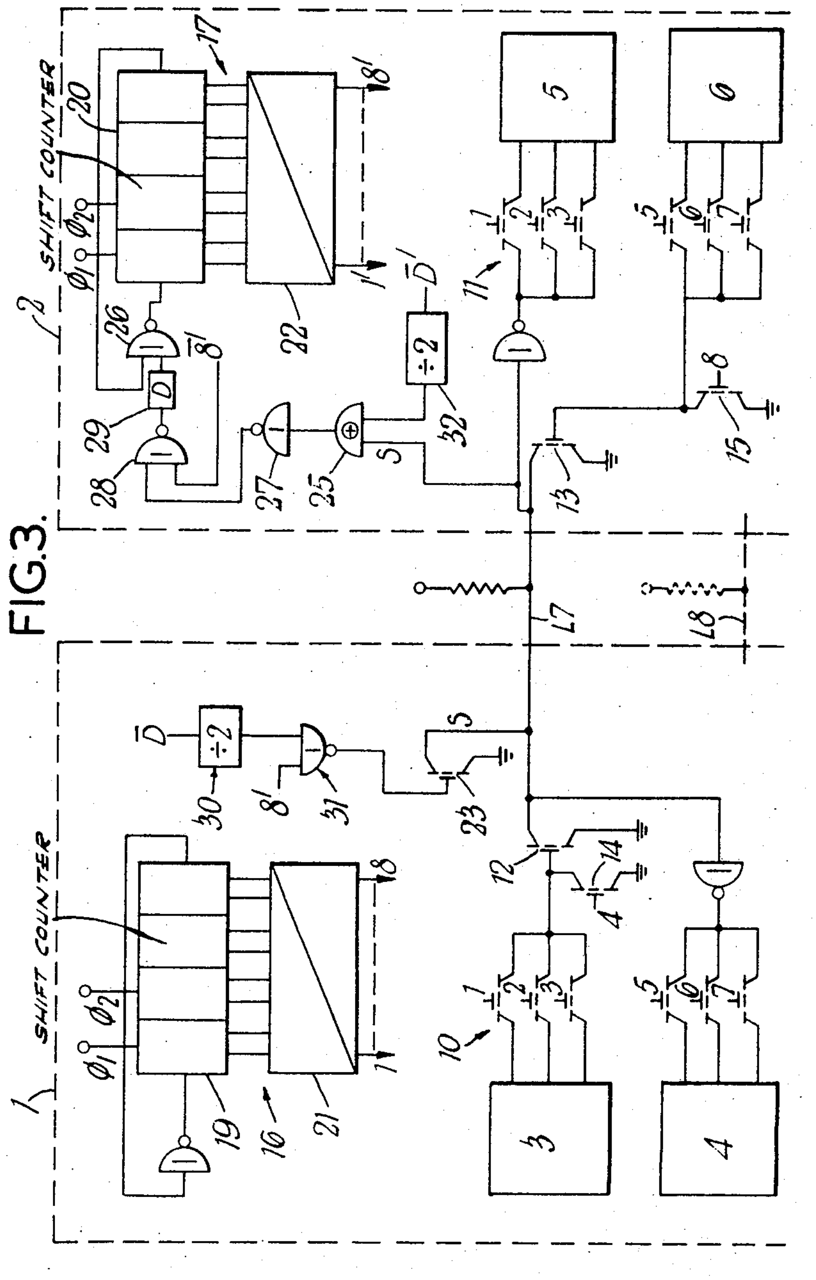
FIG. 3 is a diagram of two integrated circuits forming a bidirectional transmission system with synchronisation again via one of the data transmission lines.

FIG. 3 illustrates a further modification similar to the embodiment of FIG. 1 in its arrangement for achieving bidirectional data transmission, but similar to the embodiment of FIG. 2 in employing the data transmission line L7 for synchronisation.

In this case, it is to be noted that the rate of change of digital data at the outputs of logic circuits 3 and 6 is slower than the switching rate of the MIS elements 10 and 11. Accordingly, the data in any one time slot will frequently remain the same for two successive occurrencies of the time slot, i.e., will include the sequences "1 1" and "0 0." To avoid confusion wih such sequences in the data, the synchronising signal, looked at in successive ones of the synchronising time slots 8, is "10101 . . . ." This signal is obtained on the master chip by dividing by two one of the outputs, other than output 8, of the counter 19 or one of the outputs of the decoder 21. By way of example, output $\overline{D}$ is selected in the illustrated case. However, it may be found preferable to select one of those outputs which does not change at the same time as the time slot 8 signal, i.e., signals B or C or time slot signals 2 to 6.

The selected output (line $\overline{D}$ of FIG. 4) is fed to a "divide-by-two" circuit 30, for example a J-K or a D-type bistable circuit, which produces a signal as shown at the line denoted 30 in FIG. 4. This signal is fed to NOR gate 31 with the signal $\overline{8}$ (line $\overline{8}$ of FIG. 4) and the NOR gate output (line 31 of FIG. 4) is inverted in inverter 23 to produce the synchronising signal S (line S of FIG. 4) fed to line L7. This signal S has the value "1" in time slots 1 to 7 to isolate the line L7 from the means generating the synchronising signal.

The synchronising means of the slave chip are in substance the same as in the embodiment of FIG. 2. However, the inverter 27 and gate 28 are shown in an alternative position, whilst the exclusive OR gate 25 is fed with a signal from a divide-by-two circuit 32 fed from the $\overline{D}$ output of the counter 20.

Line $\overline{D}$ of FIG. 4 shows the output $\overline{D}$ of the slave counter 20 for an out-of-phase condition corresponding to that considered in relation to FIG. 2 and line 32 shows the resulting output from circuit 32. The further waveforms applicable to FIG. 3 are shown at the subsequent lines denoted 25 (3), 27 (3), $\overline{8}'$ (3), 28 (3) and 29 (3). As in the embodiment of FIG. 2, it will be seen that the counter 20 becomes blocked at slave time slot 8 until the master counter also reaches time slot 8.

Figure 5:
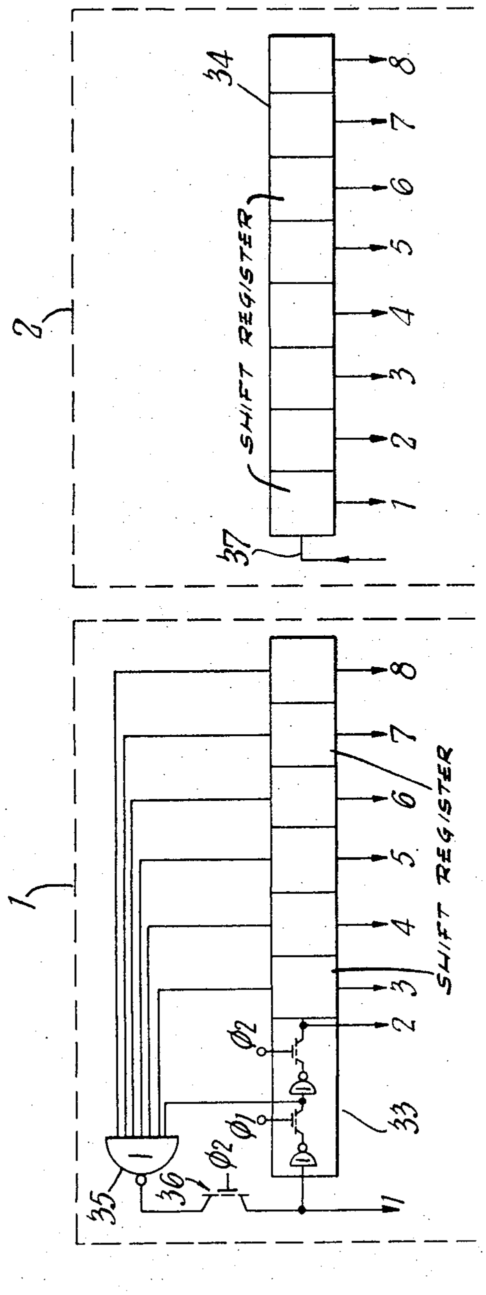
FIG. 5 is a diagram of a modification to FIGS. 1 to 3 in relation to the generation of clock pulse trains.

FIG. 5 illustrates a modification utilising shift registers 33 and 34 for generating the timing slot signals. The master chip register 33 has seven identical stages, the first of which has been shown to illustrate the way in which the stages are controlled by clock phases $\theta_1$ and $\theta_2$ and the points from which the time slot signals 1 to 8 and feedback signals are derived. The feedback signals from the stages of the register 33 feed a NOR gate 35 feeding the input of the register by way of an isolating stage 36 switched on in $\theta_2$ time. It will be appreciated that each time slot will last for the duration of a clock phase, so that a clock frequency twice that required in the embodiments of FIGS. 1 to 3 to achieve the same time slot durations is necessary.

The register 34 of the slave chip 2 has stages identical to those of the register 33 and is synchronised by supplying a bit at its input 37 in the master time slot 8.

Applying this modification to FIGS. 1 and 2, synchronisation is achieved by supplying signal 8 or $\overline{8}$ from the master chip to the slave chip via a separate synchronisation line or via a data line, as the case may be. Applying this modification to FIG. 3, divide-by-two circuits may be used to develop the required form of the synchronising signal and to reconstitute the bit to be fed to the input 37 of the register 34.

I claim:

1. In an integrated circuit including an array of digital logic elements having $n$ digital data channels, the improvement which comprises:

$m$ ($<n$) conductors for connecting said channels to corresponding channels of another such circuit; $n$ semiconductor switching devices connecting respective ones of said $n$ channels to said $m$ conductors;

clock pulse input means for receiving at least one clock pulse train; and pulse generating means having input means connected to said clock pulse input means and output means connected to said switching elements and being operable to produce a plurality of pulse trains, having different phases and a repetition rate determined by said at least one clock pulse train, for controlling the switching of said switching devices for a multiplexed transmission of data between said $n$ channels and said $m$ conductors.

2. A circuit as claimed in claim 1, wherein said pulse generating means comprises a shift register.

3. A circuit as claimed in claim 1, wherein said pulse generating means comprises a decoder for deriving said plurality of pulse trains from a clock controlled counter.

4. A circuit as claimed in claim 3, wherein said clock-controlled counter is defined by elements of said integrated circuit and is connected to said clock pulse input means.

5. A circuit as claimed in claim 1 and including synchronising means for synchronising the operation of said switching elements of said circuit with the operation of the switching elements of another such circuit.

6. A circuit as claimed in claim 5, wherein the synchronising means includes a synchronising conductor, additional to said $m$ conductors, for connection to the corresponding conductor of another such circuit for transferring synchronising signals between said circuits.

7. A circuit as claimed in claim 5, wherein the synchronising means includes a synchronising conductor, which is one of said $m$ conductors, for transferring synchronising signals between the circuit and another such circuit.

8. A circuit as claimed in claim 5 and which is a master circuit said synchronising means of which includes a synchronising conductor and means for producing synchronising signals on said synchronising conductor for transmission to the synchronising conductor of a slave circuit according to claim 1.

9. A circuit as claimed in claim 5 and which is a slave circuit said synchronising means of which includes a synchronising conductor and means constructed to synchronise the operation of said circuit in accordance with synchronising signals supplied to said synchronising conductor from a master circuit according to claim 1.

10. A circuit as claimed in claim 9, wherein said synchronising means includes an equivalence function device coupled to said synchronising conductor to receive a signal defining the state of a master circuit and coupled to said pulse generating means in said slave circuit to receive a signal defining the state of said slave circuit, said equivalence function device being operable to produce a signal blocking the operation of said pulse generating means until synchronisation is sensed.

11. A circuit as claimed in claim 1 and constructed for two-way digital data transmission on at least one of said $m$ conductors.

12. A circuit as claimed in claim 11, wherein said $n$ channels include a first group of data output channels and a second group of data input channels, both groups being coupled to said one of said $m$ conductors and a switch is connected to said one of said $m$ conductors to isolate said first group during periods of data reception by said second group.

13. A circuit as claimed in claim 12, and comprising an inverter connecting said first group to said one of said $m$ conductors and said switch is connected to the input of said inverter.

14. A circuit according to claim 1 and constructed for single-way transmission on at least one of said $m$ conductors.

15. A circuit as claimed in claim 8 and constructed for single-way transmission of data on at least one of said $m$ conductors, wherein said means for producing synchronising signals is provided by said pulse generating means which is operable to apply a further pulse train to said synchronising conductor and the further pulse train having a different phase position from the phase positions of said plurality of pulse trains.

16. A circuit as claimed in claim 10 and constructed for single-way transmission of data on at least one of said $m$ conductors, wherein the equivalence function device is coupled to said pulse generating means so as to receive a pulse train which has a different phase position from the phase positions of said plurality of pulse trains.

17. A circuit according to claim 8, wherein said synchronising conductor is one of said $m$ conductors and wherein said synchronising means also comprises means for deriving from said pulse generating means a waveform which defines a synchronising signal "1 0 1 0 1 . . . " the bits of which occur in successive ones of the periods between the cycles of data transmissions defined by said plurality of pulse trains.

18. A circuit as claimed in claim 17 and comprising a divide-by-two circuit for generating said synchronising signal from a pulse train provided by said pulse generating means.

19. A circuit as claimed in claim 18, wherein said pulse generating means comprises a clock-controlled counter and a decoder for deriving said plurality of pulse trains from said counter, and said divide-by-two circuit is connected to receive an output of said counter.

20. A circuit as claimed in claim 10, wherein said synchronising conductor is one of said *m* conductors and wherein said synchronising means also includes a divide-by-two circuit connected between an input of said equivalence function device and an output of said pulse generating means.

21. A circuit as claimed in claim 1 and constructed of insulated-gate field-effect devices.

22. A combination of a first and a second integrated circuit each as claimed in claim 1 and with said *m* conductors of said first circuit connected to respective ones of said *m* conductors of said second circuit, said first circuit comprising:

means for deriving from said pulse generating means of said first circuit a synchronising signal defining the phase positions of said plurality of pulse trains; and a synchronising conductor for conveying said synchronising signal from said first circuit, and said second circuit comprising:

a synchronising conductor connected to said synchronising conductor of said first circuit; and synchronising means connected to said synchronising conductor of said second circuit to receive said synchronising signal to synchronise said pulse generating means of said second circuit with said pulse generating means of the first circuit.

23. A circuit as claimed in claim 22, wherein said synchronising conductor is additional to said *m* conductors.

24. A circuit as claimed in claim 22, wherein said synchronising conductor is one of said *m* conductors.

25. A circuit as claimed in claim 24, wherein said pulse generating means of said first circuit is operable to produce an additional pulse train having a different phase position from the phase positions of said plurality of pulse trains, said means for deriving said synchronising signal comprises a divide-by-two circuit connected to receive a pulse train other than said additional pulse train from said pulse generating means and a gate connected to receive the output of said divide-by-two circuit and to receive said additional pulse train and to produce therefrom said synchronising signal of the form "1 0 1 0 1 . . . " the bits of which occur in periods defined by said additional pulse train between periods of data transmission, and said schronising means of said second circuit comprises a second divide-by-two circuit connected to receive a pulse train from said pulse generating means of said second circuit and an exclusive OR function circuit having inputs connected to said synchronising conductor of said second circuit and the output of said second divide-by-two circuit.

* * * * *